(12) United States Patent
Marty et al.

(10) Patent No.: US 8,436,440 B2
(45) Date of Patent: May 7, 2013

(54) METHOD FOR FORMING A BACK-SIDE ILLUMINATED IMAGE SENSOR

(75) Inventors: Michel Marty, Saint Paul de Varces (FR); François Leverd, Saint Ismier (FR)

(73) Assignees: STMicroelectronics (Crolles 2) SAS, Crolles (FR); STMicroelectronics S.A., Montrouge (FR)

( * ) Notice: Subject to any disclaimer, the term of this patent is extended or adjusted under 35 U.S.C. 154(b) by 262 days.

(21) Appl. No.: 12/942,451

(22) Filed: Nov. 9, 2010

(65) Prior Publication Data
US 2011/0108939 A1    May 12, 2011

(30) Foreign Application Priority Data

Nov. 10, 2009    (FR) ...................................... 09 57950

(51) Int. Cl.
*H01L 31/14* (2006.01)
(52) U.S. Cl.
USPC .............................. 257/432; 438/73; 438/430
(58) Field of Classification Search .................... 257/32, 257/E31.097, 290–292, 432, 443, 447, 460, 257/E31.055, E27.13, E31.113, E31.121; 438/48, 73, 75, 414, 430, 433; 348/294, 348/E05.091
See application file for complete search history.

(56) References Cited

U.S. PATENT DOCUMENTS

| 6,667,528 | B2 * | 12/2003 | Cohen et al. ................... 257/469 |
| 7,387,907 | B2 * | 6/2008 | Hsu et al. ......................... 438/59 |
| 2007/0128954 | A1 | 6/2007 | Itonaga |
| 2008/0297634 | A1 | 12/2008 | Uya |
| 2009/0057801 | A1 | 3/2009 | Goushcha et al. |

FOREIGN PATENT DOCUMENTS

| JP | 2005150521 A  * | 6/2005 |
| JP | 2009088030 A | 4/2009 |
| WO | WO 2009107755 A1 | 9/2009 |

OTHER PUBLICATIONS

French Search Report dated Jun. 25, 2010 from French Patent Application 09/579580 filed Nov. 10, 2009.

* cited by examiner

*Primary Examiner* — Marcos D. Pizarro
*Assistant Examiner* — Sue Tang
(74) *Attorney, Agent, or Firm* — Wolf, Greenfield & Sacks, P.C.

(57) ABSTRACT

A method for manufacturing a back-side illuminated image sensor, including the steps of: forming, inside and on top of an SOI-type silicon layer, components for trapping and transferring photogenerated carriers and isolation regions; forming a stack of interconnection levels on the silicon layer and attaching, on the interconnect stack, a semiconductor handle; removing the semiconductor support; forming, in the insulating layer and the silicon layer, trenches reaching the isolation regions; depositing a doped amorphous silicon layer, more heavily doped than the silicon layer, at least on the walls and the bottom of the trenches and having the amorphous silicon layer crystallize; and filling the trenches with a reflective material.

20 Claims, 3 Drawing Sheets

METHOD FOR FORMING A BACK-SIDE ILLUMINATED IMAGE SENSOR

CROSS REFERENCE TO RELATED APPLICATIONS

This application claims the priority benefit of French patent application Ser. No. 09/57950, filed on Nov. 10, 2009, entitled "METHOD FOR FORMING A BACK-SIDE ILLUMINATED IMAGE SENSOR," which is hereby incorporated by reference to the maximum extent allowable by law.

BACKGROUND OF THE INVENTION

1. Field of the Invention

The present invention relates to a method for forming a back-side illuminated image sensor comprising pixels isolated from one another.

2. Discussion of the Related Art

Back-side illuminated image sensors are increasingly used in photodetection devices. In such sensors, conductive tracks and vias connecting the different photodetection components are formed on a first surface of a semiconductor layer, the device being illuminated on the second surface or back side of this layer. Thus, the conductive tracks and vias do not disturb the passing of light rays intended to photogenerate electron/hole pairs in the semiconductor layer.

A back-side illuminated image sensor is generally constructed as follows. It is started from a structure of semiconductor-on-insulator type (SOI), that is, a single-crystal semiconductor layer resting on a semiconductor support or substrate with an interposed oxide layer. Regions for trapping photogenerated carriers and elements capable of transferring these carriers, for example, MOS transistors, are formed inside and on top of the semiconductor layer, these elements defining pixels. A stack of interconnection levels in which are formed conductive tracks and vias separated by an insulating material, is formed on the device. The conductive tracks and vias enable to connect the different electronic elements of the device together and to external contacts.

Then, another substrate, generally a silicon wafer called handle wafer, is attached to the upper portion of the interconnect stack. The initial semiconductor support or substrate, supporting the semiconductor layer, is then removed by using the oxide layer of the SOI structure as a stop layer. Then, an antireflection layer, color filters, and/or microlenses are formed on the apparent surface or back side of the semiconductor layer intended to be illuminated, opposite to the interconnect stack.

A permanent concern in the forming of back-side illuminated image sensors is the isolation between pixels of a same sensor. Indeed, crosstalk phenomena may occur between two pixels, be it by traveling of a photon towards a neighboring pixel (optical crosstalk) or by traveling of a photogenerated carrier (electron or hole) towards a neighboring pixel (electronic crosstalk). Such parasitic phenomena result in erroneous detections.

Thus, there is a need for a method for forming a back-side illuminated image sensor which strongly limits such parasitic effects.

SUMMARY OF THE INVENTION

An object of an embodiment of the present invention is to provide a method for forming an image sensor from which parasitic phenomena are eliminated.

Thus, an embodiment of the present invention provides a method for manufacturing a back-side illuminated image sensor, comprising the steps of: (a) forming, inside and on top of a silicon layer extending on a semiconductor support with an interposed insulating layer, electronic components for trapping and transferring photogenerated carriers and regions for isolating the components; (b) forming a stack of interconnection levels on the silicon layer and attaching, at the surface of the interconnect stack, a semiconductor handle; (c) removing the semiconductor support; (d) forming, in the insulating layer and the silicon layer, trenches reaching the isolation regions; (e) depositing a doped amorphous silicon layer, more heavily doped than the silicon layer, at least on the walls and the bottom of the trenches and having the amorphous silicon layer crystallize; and (f) filling the trenches with a reflective material.

According to an embodiment of the present invention, step (e) is preceded by a step of smoothing of the walls of the trenches by means of a chemical solution.

According to an embodiment of the present invention, step (d) is preceded by a step of forming of a hard mask on the insulating layer.

According to an embodiment of the present invention, the amorphous silicon layer is doped with the same conductivity type as the silicon layer.

According to an embodiment of the present invention, the reflective material is a metal.

According to an embodiment of the present invention, each isolation region is formed at least of a doped region of the same conductivity type as the silicon layer, more heavily doped than the silicon layer.

According to an embodiment of the present invention, the silicon layer has a thickness ranging between 2 and 5 µm.

An embodiment of the present invention further provides a back-side illuminated image sensor, comprising a silicon layer on a first surface of which are formed components for trapping and transferring photogenerated carriers and regions for insulating components, the silicon layer being intended to be illuminated on a second surface, further comprising trenches starting from the second surface and extending into the isolation regions, the walls of the trenches being covered with a doped single-crystal silicon layer of the same conductivity type as the silicon layer, more heavily doped than the silicon layer, the trenches being filled with a reflective material.

According to an embodiment of the present invention, the second surface of the silicon layer is covered with a thermal oxide layer.

According to an embodiment of the present invention, the first surface of the silicon layer is covered with a stack of interconnection levels and with a semiconductor handle wafer.

BRIEF DESCRIPTION OF THE DRAWINGS

The foregoing and other objects, features, and advantages of the present invention will be discussed in detail in the following non-limiting description of specific embodiments in connection with the accompanying drawings, among which

DETAILED DESCRIPTION

Figure 1:
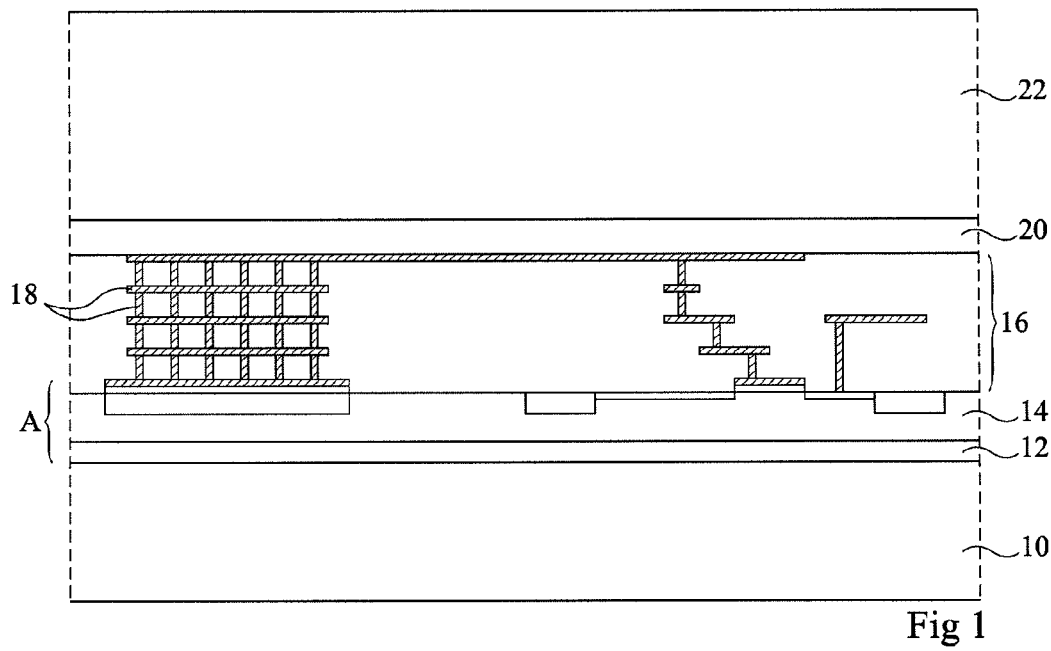
FIGS. 1 to 9 illustrate results of successive steps of a method according to an embodiment of the present invention.

For clarity, the same elements have been designated with the same reference numerals in the different drawings and, further, as usual in the representation of integrated image sensors, the various drawings are not to scale.

To limit crosstalk phenomena in back-side illuminated image sensors, the present inventors provide to completely isolate the photon absorption regions from one another by forming, across the entire thickness of the semiconductor layer in which carriers are photogenerated, trenches forming a barrier against the displacements of photons and of photogenerated carriers.

FIGS. 1 to 9 illustrate results of successive steps of a method according to an embodiment of the present invention.

At an initial step illustrated in FIG. 1, it is started from a structure comprising a semiconductor support or substrate 10 at the surface of which an insulating layer 12 is formed, the insulating layer being coated with a single-crystal silicon layer 14 (structure of semiconductor on insulator type, SOI). Silicon layer 14 for example has a thickness ranging between 2 and 5 μm to detect as many light rays of the visible range as possible. Layer 14 may be doped at a dopant concentration ranging between $10^{15}$ and $5.10^{16}$ at./cm³. Regions for trapping photogenerated carriers and charge transfer components which will be described in further detail hereafter are formed inside and on top of silicon layer 14. On top of silicon layer 14 is formed a stack of interconnection layers 16 comprising conductive tracks and vias 18 insulated from one another. At the surface of interconnect stack 16 is formed an insulating layer 20, for example, made of oxide, on which is placed a support or semiconductor handle 22. In the left-hand portion of interconnect stack 16 of FIG. 1 is shown an example of a structure enabling to form a contact on the rear surface of layer 14. It should be noted that the present invention applies to any structure formed in the interconnect stack.

This structure may be obtained from an initial SOI-type structure by carrying out the steps of: epitaxially forming a silicon layer of desired thickness on the SOI structure; forming electronic transfer components and regions for trapping carriers inside and on top of the silicon layer; forming an interconnect stack on the structure; and attaching a handle wafer on the interconnect stack. These method steps being known per se, they will not be described in further detail herein. It should be noted that silicon layer 14 may be gradually doped.

In the following description, the method steps will be described by only considering a limited region A of the structure of FIG. 1, comprising insulating layer 12, silicon layer 14, and the components formed inside and on top of layer 14. Thus, the portion located above silicon layer 14 (interconnect stack 16 and handle 22) will not be shown in the following drawings, since this portion does not vary afterwards.

Figure 2:
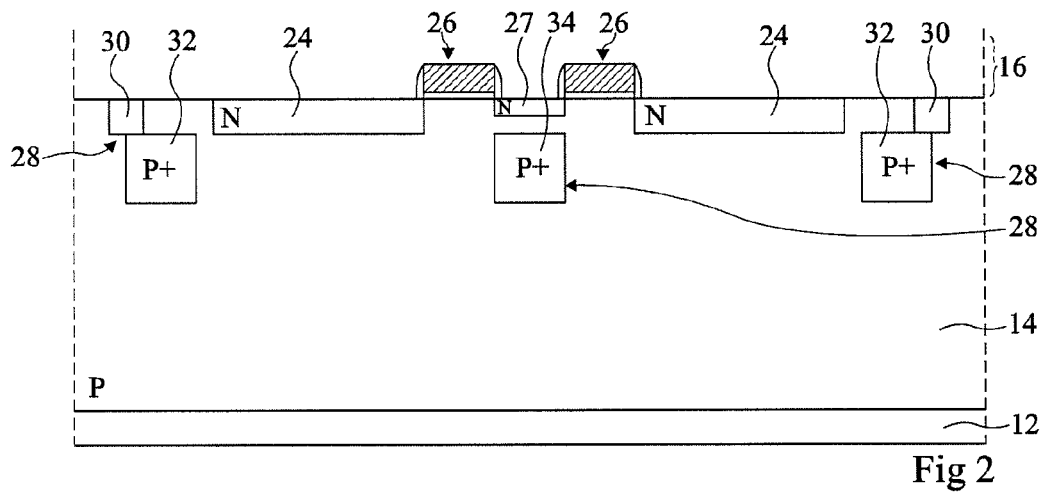

FIG. 2 shows portion A of the structure of FIG. 1 after the removal of semiconductor support 10, for example, by a grinding and/or etch step selective over insulating layer 12. Portion A thus comprises a stack of an insulating layer 12, of a silicon layer 14, and of interconnection levels 16 (not shown). In the example of FIG. 2, various components and doped regions have been shown inside and on top of silicon layer 14. Regions 24 for trapping the photogenerated charges, N-type doped electronic trapping regions in the shown example, are formed in silicon layer 14, layer 14 being P-type doped. As an example, regions 24 may be doped at a dopant concentration ranging between $10^{18}$ and $10^{20}$ at/cm³. Systems for transferring the photogenerated charges, for example, MOS transistors 26, are formed at the surface of silicon layer 14. N-type doped areas 27 enabling to read the photogenerated charges may also be formed at the surface of silicon layer 14. It should be noted that the layout of these elements may be different from that shown in the drawings, and that the regions for trapping, transferring, and reading photogenerated carriers may be of any known type.

Pixel isolation regions 28 are provided around each pixel of the image sensor. It should be noted that these isolation regions may be formed around each assembly comprised of a photogenerated carrier trapping region and of a charge transfer element, or around each trapping region if the charge transfer elements are common to several trapping regions. The isolation regions may be of different types.

In a first case, isolation region 28 comprises a first so-called shallow trench isolation region 30 (STI), generally made of oxide, formed at the surface of layer 14, and heavily-doped P-type region 32. For example, region 32 may be formed under region 30 or, as shown, it may slightly offset with respect to region 30. Region 32 may also extend so as to contact regions 24 for trapping photogenerated charges and/or all the way to the surface of layer 14. Region 32 may extend down a 1-μm depth into layer 14.

In a second case, isolation region 28 is formed of a single heavily-doped P-type region 34 extending vertically in layer 14, for example down to a 1-μm depth. In the shown example, region 34 extends under charge reading area 27, said area being common to two MOS transfer transistors 26. Isolation regions 28 comprising a single region 34 may also be provided around carrier trapping regions 24.

Doped regions 32 and 34 may advantageously be formed with a low implantation power. Regions 32 and 34 may have a surface width of layer 14 on the order of 0.4 μm and be doped at a dopant concentration ranging between $10^{18}$ and $10^{20}$ at./cm³. It should be noted that the present invention also applies to other image sensor pixel surface isolation structures.

The various known isolation structures enable to attenuate the crosstalk between pixels. However, they do not cancel it, photons or photogenerated carriers being capable of flowing through layer 14 under these structures.

Figure 3:
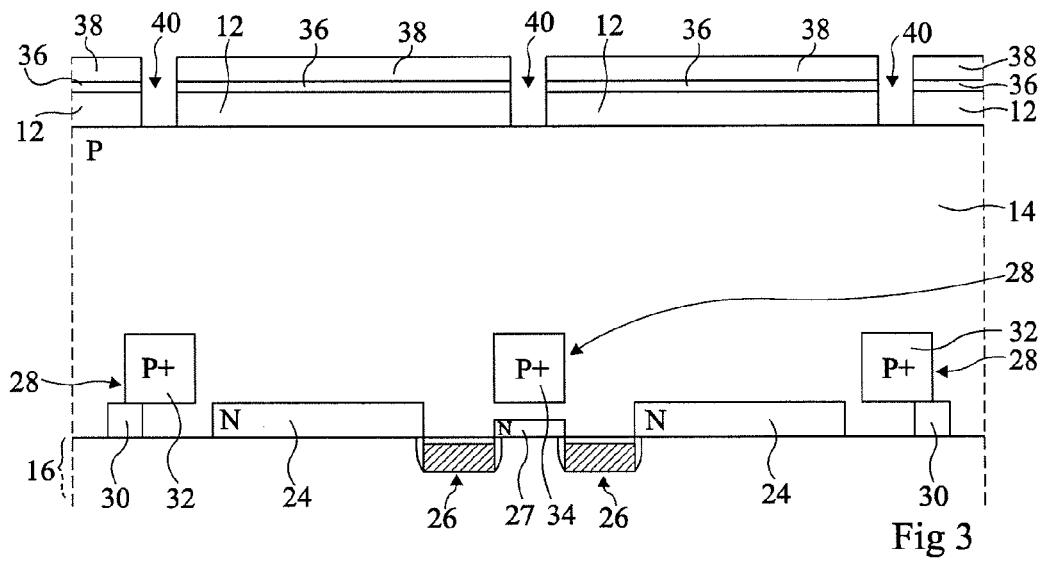

At the step illustrated in FIG. 3, the device has been flipped to work on the rear surface of silicon layer 14 (opposite to handle 22). On insulating layer 12 is formed a hard insulating mask, for example, comprising a stack of a silicon nitride layer 36 having a thickness ranging between 40 and 60 nm, for example, 50 nm, and of a tetraethyl orthosilicate (TEOS) or silicon oxide layer 38 having a thickness ranging between 200 and 400 nm, for example, 300 nm. It should be noted that the thickness of these layers is not limiting. As an example, stack 36/38 may be formed by plasma-enhanced chemical vapor deposition (PECVD). Such a deposition will preferably be performed at a temperature lower than 400° C. to avoid the degradation of the components and conductive tracks and vias formed inside and on top of layer 14.

A resin mask (not shown) is then formed on stack 36/38. Openings are formed in the resin mask in front of pixel isolation regions 28. By means of the resin mask, openings 40 are defined by etching in the insulating stack formed of layers 12, 36, and 38. This etching may be a chemical etching under oxygen based on argon and/or hexafluorobutadiene ($C_4F_6$), octafluorobutene (COO, or tetrafluoromethane ($CF_4$). Thus, openings 40 are located in front of isolation regions 28. Openings 40 may have dimensions at the surface of silicon layer 14 ranging between 0.1 μm and 0.3 μm.

Figure 4:
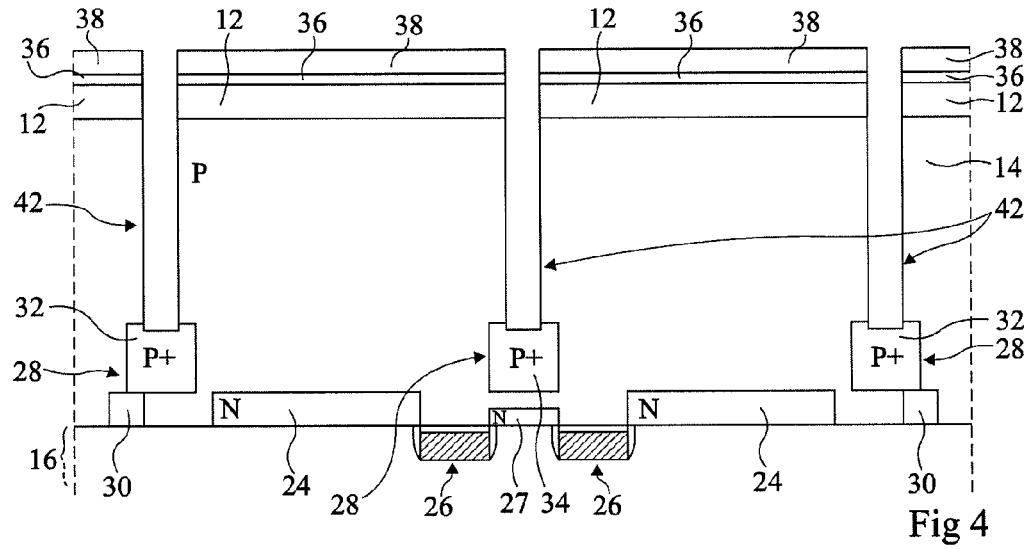

At the step illustrated in FIG. 4, silicon layer 14 has been etched in front of openings 40 to form trenches 42. Trenches 42 cross layer 14 and reach pixel isolation regions 28. Trenches 42 can extend into isolation regions 28 such that they completely isolate the photogeneration regions from each other. As an example, this etching may be a dry etch performed in oxygen, for example by means of hydrogen bromide and/or sulfur hexafluoride. This etching has the advantage of forming trenches 42 having a very straight profile and of being selective over stack 12, 36, 38. Trenches 42 have a width ranging between 0.1 and 0.3 μm across their entire depth, for example, 0.2 μm. Indeed, dry etch methods allow high etch ratios (ratio between the etched depth and the width dispersion), typically greater than 15. It should be noted that a slight flaring of trenches 42 may appear at the surface of layer 14 with no adverse consequence for the rest of the process.

Figure 5:
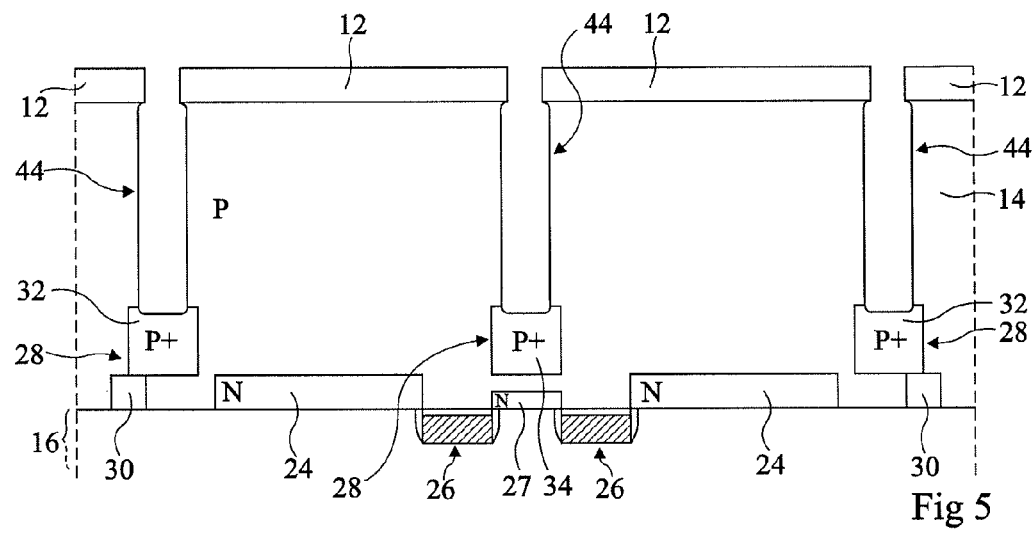

The step illustrated in FIG. 5 comprises the removal of oxide layer 38, for example, by dry plasma etching, and of the insulating silicon nitride layer 36, for example, by dry etching by means of hydrogen and $CHF_3$, $CHF_2$, $CH_3F$, or $H_3PO_4$. Then, a chemical etching of trench 42 has been performed, for example, by means of a tetramethylammonium hydroxide (TMAH) or sulfur hexafluoride ($SF_6$) solution. This cleaning enables obtaining trenches 44 having very smooth walls, with none of the defects which might have been generated close to the surface by the etching. Indeed, the walls of trenches 42, formed by dry etching, are not perfectly smooth and contain defects at their surface or close to their surface, which may cause the occurrence of unwanted dark currents. This smoothing necessitates a slight widening of trenches 42. The walls of trenches 44 are thus distant by from 5 to 15 nm from the walls of trenches 42.

Figure 6:
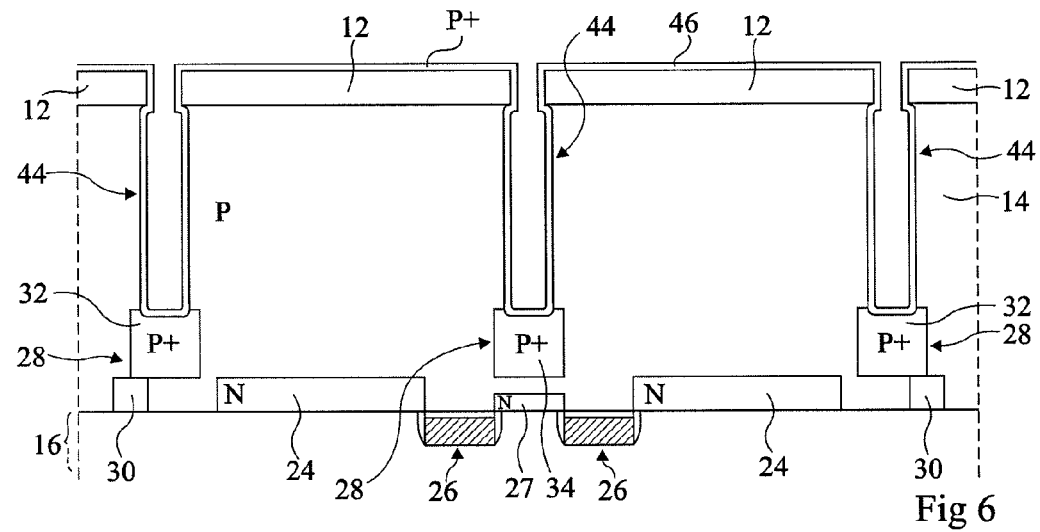

At the step illustrated in FIG. 6, a P-type doped amorphous silicon layer 46, in the present case, of the same conductivity type as silicon layer 14, more heavily-doped than layer 14 (for example, at a dopant concentration ranging to between $10^{19}$ and $10^{20}$ at./cm³), has been formed over the entire rear surface of the structure, that is, on insulating layer 12 and on the walls and the bottom of trenches 44. For example, the amorphous silicon layer may be formed by deposition of tri-bosilane at approximately 400° C. A crystallization of amorphous silicon layer 46 is then performed. This crystallization may be carried out by annealing at 450° C., in the same machine as that used for the amorphous silicon deposition. The crystallization of the amorphous silicon layer 46 may also be obtained by other processes known by those skilled in the art, for example by a localized laser treatment, a fast anneal (for example an "RTA" anneal, Rapid Thermal Annealing), or any known adapted process.

The crystallization of amorphous silicon layer 46 enables to form, on the walls of trenches 44, a thin doped single-crystal silicon layer and, on insulating layer 12, a thin amorphous silicon layer slightly polycrystalline. Indeed, polysilicon crystallizes less rapidly than single-crystal silicon.

Figure 7:
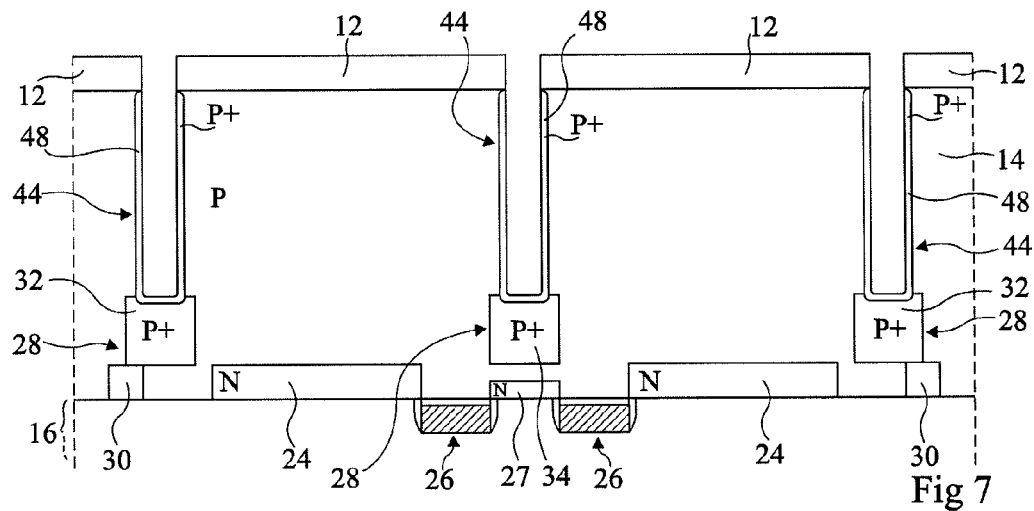

At the step illustrated in FIG. 7, the slightly polycrystalline amorphous silicon formed on insulating layer 12 has been removed, for example, by etching by means of gas phase hydrochloric acid. There then only remains of initial amorphous silicon layer 46 a single-crystal silicon layer 48 extending on the walls and the bottom of trenches 44.

Figure 8:
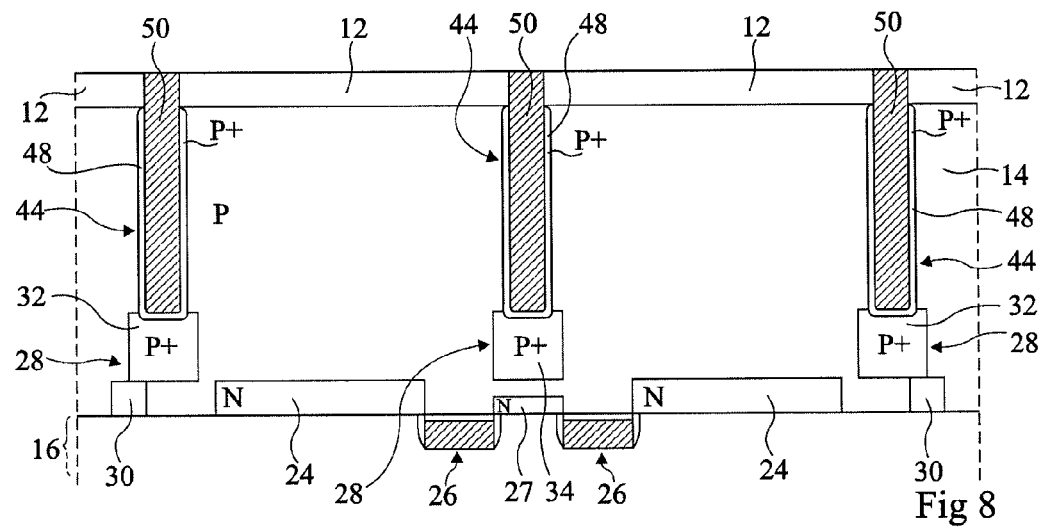

At the step illustrated in FIG. 8, a metal or a reflective material 50 has been deposited to fill trenches 44. As an example, material 50 may be aluminum deposited at a temperature close to 200° C., or a stack of titanium and titanium nitride. The metal or the reflective material possibly formed on insulating layer 12 is then removed by etching, for example, by dry etching in $BCl_3$ if the metal is a titanium alloy, or by chem.-mech. polishing (CMP). It should be noted that a thin oxide layer, having a thickness ranging between 1 and 20 nm, may be formed if desired on the walls and the bottom of trenches 44 before filling said trenches with material 50.

Figure 9:
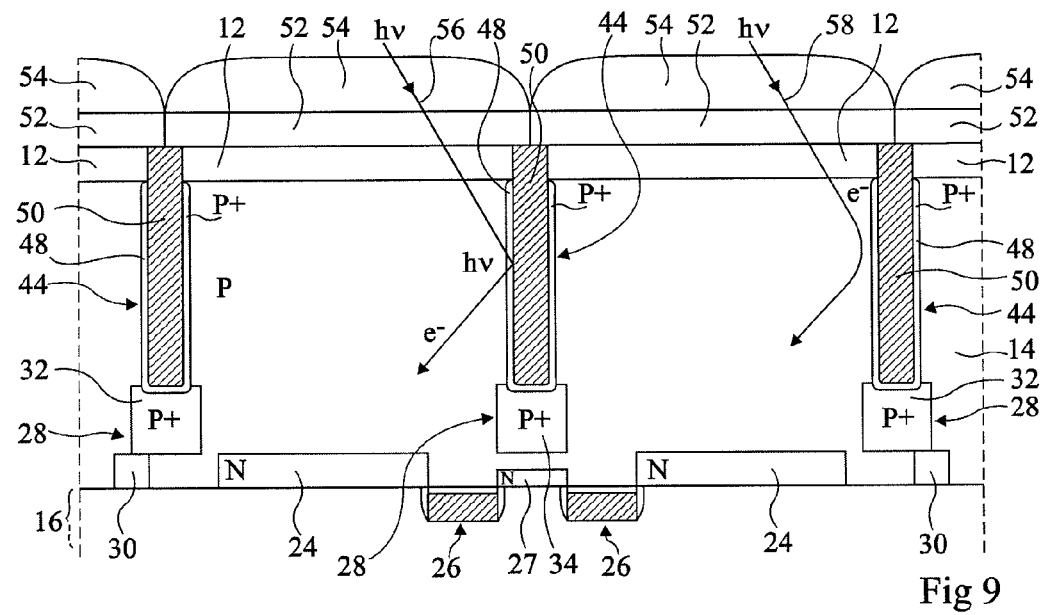

At the step illustrated in FIG. 9, conventional image detector elements, in the shown example, color filters 52 supporting microlenses 54, have been formed on insulating layer 12. It should be noted that any other conventional element of photodetectors may be formed on layer 12, for example, a nitride antireflection layer.

FIG. 9 shows two light rays of different wavelengths reaching the image sensor surface in the case where silicon layer 14 is P-type doped.

A first ray or photon (hv) 56 reaches the sensor surface with a non-zero incidence and travels in silicon layer 14 to reach a trench 44. Material 50 present in trenches 44 behaves as a mirror for photon 56, which is reflected towards carrier trapping region 24. Reflected photon 56 then generates an electron/hole pair, the electron ($e^-$) being attracted and trapped by region 24.

A second ray or photon (hv) 58, having a wavelength smaller than that of first ray 56, reaches the sensor surface with a non-zero incidence and generates an electron/hole pair as soon as it enters silicon layer 14. The electron ($e^-$) originating from this photon then moves towards a trench 44. The presence of heavily-doped single-crystal layer 48 and its doping difference with silicon layer 14 creates an electric field which pushes the electron back towards the center of the pixel. The electron thus reaches collection region 24.

Thus, trenches 44 play a double role. The presence of heavily-doped layer 48 enables to push the electrons back towards the trapping region and the presence of the reflective material in trenches 44 enables to reflect the incident photons. Thus, whatever the wavelength of an incident ray, the electron/hole pair that it will generate in silicon layer 14 will be detected by the associated photodetection cell. Trenches 44 thus enable avoiding any crosstalk phenomenon between pixels, be it by optical crosstalk (passing of a photon to a neighboring photodetection cell) or by electronic crosstalk (passing of a carrier, electron, or hole, to a neighboring photodetection cell).

Further, advantageously, trenches 44 have relatively small dimensions at the surface of layer 14, which provides a high useful surface area to total surface area ratio for each pixel.

Finally, the interface between insulating layer 12 and silicon layer 14 is of good quality, insulating layer 12 generally being a thermal oxide layer. Indeed, in methods for forming structures of semiconductor on insulator type, the intermediary insulating layer is formed by thermal oxidation of the surface of the semiconductor support. The interface between oxide and semiconductor then is of good quality, which enables avoiding dark current generation phenomena at the interface between the oxide and the semiconductor.

Specific embodiments of the present invention have been described. Various alterations and modifications will occur to those skilled in the art. In particular, it should be noted that the conductivity types of the different doped regions disclosed herein may be inverted, the trapping in regions 24 then being a trapping of holes and not of electrons.

Such alterations, modifications, and improvements are intended to be part of this disclosure, and are intended to be within the spirit and the scope of the present invention.

Accordingly, the foregoing description is by way of example only and is not intended to be limiting. The present invention is limited only as defined in the following claims and the equivalents thereto.

What is claimed is:

1. A method for manufacturing a back-side illuminated image sensor, comprising the steps of:
   (a) forming, inside and on top of a silicon layer extending on a semiconductor support with an interposed insulating layer, electronic components for trapping and transferring photogenerated carriers and regions for isolating said components;
   (b) forming a stack of interconnection levels on the silicon layer and attaching, at the surface of the interconnect stack, a semiconductor handle;
   (c) removing the semiconductor support;
   (d) forming, in the insulating layer and the silicon layer, trenches reaching the isolation regions;
   (e) depositing a heavily-doped amorphous silicon layer at least on the walls and the bottom of the trenches and having said amorphous silicon layer crystallize; and
   (f) filling the trenches with a reflective material.

2. The method of claim 1, wherein step (e) is preceded by a step of smoothing of the walls of the trenches by means of a chemical solution.

3. The method of claim 1, wherein step (d) is preceded by a step of forming of a hard mask on the insulating layer.

4. The method of claim 1, wherein the amorphous silicon layer is doped with the same conductivity type as the silicon layer.

5. The method of claim 1, wherein the reflective material is a metal.

6. The method of claim 1, wherein each isolation region is formed at least of a heavily-doped region of the same conductivity type as the silicon layer.

7. The method of claim 1, wherein the silicon layer has a thickness ranging between 2 and 5 µm.

8. A method for making a back-side illuminated image sensor, comprising:
   providing a silicon layer on a semiconductor support, with an insulating layer between the silicon layer and the semiconductor support;
   forming, on a front side of the silicon layer, electronic components of the image sensor;
   forming an interconnect stack on the front side of the silicon layer;
   attaching a semiconductor handle to the interconnect stack and removing the semiconductor support;
   forming trenches extending from a back side of the silicon layer toward the front side; and
   depositing in the trenches a material which reflects incident photons.

9. A method for making a back-side illuminated image sensor as defined in claim 8, further comprising forming, on a front side of the silicon layer, isolation regions between pixels of the image sensor, wherein the trenches extend from the back side of the silicon layer to the isolation regions.

10. A method for making a back-side illuminated image sensor as defined in claim 9, wherein the isolation regions are formed of a heavily-doped region of the same conductivity type as the silicon layer.

11. A method for making a back-side illuminated image sensor as defined in claim 8, wherein depositing further includes coating the trenches with a layer which repels photogenerated carriers and filling the trenches with the material which reflects incident photons.

12. A method for making a back-side illuminated image sensor as defined in claim 11, wherein coating comprises depositing a heavily-doped amorphous silicon layer in the trenches and causing the amorphous silicon layer to crystallize and form a single crystal silicon layer.

13. A method for making a back-side illuminated image sensor as defined in claim 12, wherein the amorphous silicon layer is doped with the same conductivity type as the silicon layer.

14. A method for making a back-side illuminated image sensor as defined in claim 12, further comprising forming an oxide layer between the single crystal silicon layer and the material which reflects incident photons.

15. A method for making a back-side illuminated image sensor as defined in claim 8, further comprising smoothing walls of the trenches before depositing the material which reflects incident photons.

16. A method for making a back-side illuminated image sensor as defined in claim 8, further comprising forming a mask on the insulating layer before forming trenches.

17. A method for making a back-side illuminated image sensor as defined in claim 8, wherein the material which reflects incident photons is a metal.

18. A method for making a back-side illuminated image sensor as defined in claim 8, wherein the silicon layer has a thickness between 2 micrometers and 5 micrometers.

19. A method for making a back-side illuminated image sensor as defined in claim 8, wherein the trenches are formed by dry etching in oxygen.

20. A method for making a back-side illuminated image sensor as defined in claim 8, wherein the trenches have a width between 0.1 micrometer and 0.3 micrometer.

* * * * *